(12) United States Patent
Schaffer et al.

(10) Patent No.: US 7,427,898 B2
(45) Date of Patent: Sep. 23, 2008

(54) DETECTING AMPLIFIER OUT-OF-RANGE CONDITIONS

(75) Inventors: Viola Schaffer, Erlangen (DE); Mikhail Ivanov, Erlangen (DE)

(73) Assignee: Texas Instruments Deutschland GmbH, Freising (DE)

( * ) Notice: Subject to any disclaimer, the term of this patent is extended or adjusted under 35 U.S.C. 154(b) by 87 days.

(21) Appl. No.: 11/462,842

(22) Filed: Aug. 7, 2006

(65) Prior Publication Data

US 2007/0194843 A1      Aug. 23, 2007

(30) Foreign Application Priority Data

Aug. 5, 2005   (DE)   ........................ 10 2005 037 013

(51) Int. Cl.
*H03F 3/04*   (2006.01)
(52) U.S. Cl. ........................ 330/311; 330/310
(58) Field of Classification Search ................ 330/311, 330/310, 252, 257, 261
See application file for complete search history.

(56) References Cited

U.S. PATENT DOCUMENTS

| | | | | |
|---|---|---|---|---|
| 3,927,383 A | * | 12/1975 | Fjarlie et al. ................. 330/59 |
| 5,451,909 A | * | 9/1995 | Fattaruso ..................... 330/311 |
| 6,323,703 B1 | | 11/2001 | Fotouhi | |
| 6,590,456 B2 | * | 7/2003 | Yang ........................... 330/311 |
| 7,015,736 B1 | * | 3/2006 | Sudjian et al. ............... 327/157 |
| 7,020,793 B1 | * | 3/2006 | Hsieh .......................... 713/401 |
| 7,190,230 B1 | * | 3/2007 | Jin et al. ...................... 330/311 |

* cited by examiner

*Primary Examiner*—Henry K Choe
(74) *Attorney, Agent, or Firm*—Warren L. Franz; Wade J. Brady, III; Frederick J. Telecky, Jr.

(57) ABSTRACT

Out-of-range conditions are detected in amplifier CMOS or BiCMOS circuitry that includes a control transistor ($M_S$) connected in series with a cascode transistor ($M_{SC}$), and a differential amplifier (A1) with an inverting input connected to the node between the control transistor and the cascode transistor, a non-inverting input connected to a reference voltage source ($VR_{DS}$) and an output connected to the gate of the cascode transistor ($M_{SC}$). The voltage at the output of the differential amplifier (A1) is monitored, and an error condition is determined when the voltage exceeds or drops below a predetermined threshold value. The invention considerably widens the useful operating range, without requiring sophisticated or complex detection circuitry.

22 Claims, 2 Drawing Sheets

○ ERROR DETECTION POINT: TRADITIONAL METHOD

● ERROR DETECTION POINT: PROPOSED METHOD

DETECTING AMPLIFIER OUT-OF-RANGE CONDITIONS

CROSS-REFERENCE TO RELATED APPLICATIONS

This application claims priority of German Patent Application Serial No. 10 2005 037 013.6, filed Aug. 5, 2005.

TECHNICAL FIELD

The invention relates to a method of detecting amplifier out-of-range conditions and to an amplifier with CMOS or BiCMOS amplifier circuitry.

BACKGROUND

Out-of-range conditions of an amplifier typically occur when the amplifier's inputs are outside of the common mode input range or when the output voltage of the amplifier gets too close to the voltage level of either supply rail due to a load error or an overdrive condition. Depending on the particular application, an error indication is needed to signal such an out-of-range condition.

Traditionally, analog amplifiers have no detection and indication mechanism for out-of-range conditions. At best, a conventional method of detecting an out-of-range condition is to employ comparators that monitor the amplifier's input and/or output voltages and trip at a set voltage from the rail levels. Since, however, the criticality of the voltage at the conventional monitoring point depends largely on temperature and process variations, the threshold voltage must be set away from an ideal value, thereby reducing the useful operating range of the amplifier. Another problem is that, since the voltage at the monitoring point behaves linearly in the useful operating range, any inaccuracy of the comparator and reference source used in the detection circuitry contributes directly to the overall detection error. Consequently, a relatively wide error margin must be built into the system.

SUMMARY OF THE INVENTION

The invention provides a method of detecting out-of-range conditions in amplifier CMOS or BiCMOS circuitry that considerably widens the useful operating range without requiring sophisticated or complex detection circuitry. Specifically, the method of the invention is intended to be used in amplifier CMOS or BiCMOS circuitry that includes a control transistor connected in series with a cascode transistor, and a differential amplifier with an inverting input connected to the node between the control transistor and the cascode transistor, a non-inverting input connected to a reference voltage source and an output connected to the gate of the cascode transistor. According to the invention, the voltage at the output of the differential amplifier is monitored and an error condition is determined when the voltage exceeds or drops below a predetermined threshold value. The invention uses the fact that the output of the differential amplifier has a very steep transfer function before railing occurs. Although the transfer function at the output of the differential amplifier is indeed temperature and process dependent, such dependency only results in shifting the step in the function to higher or lower values of the operating voltage (the voltage difference from the input voltage to the negative rail). To accurately detect the occurrence of the step in the transfer function, it is only necessary to detect when the voltage at the output of the differential amplifier exceeds or drops below a predetermined threshold value, and the threshold value can be selected without building an error margin into the system. Accordingly, the useful operating range is extended. A simple, low-accuracy inverter with a relatively high threshold voltage can be used as an error detector.

The invention also provides an amplifier with CMOS or BiCMOS amplifier circuitry that includes a control transistor connected in series with a cascode transistor and a differential amplifier with an inverting input connected to the node between the control transistor and the cascode transistor, a non-inverting input connected to a reference voltage source and an output connected to the gate of the cascode transistor. The amplifier further comprises a voltage detector with an input connected to the output of the differential amplifier. The voltage detector provides an error output in response to the voltage at the output of the differential amplifier exceeding or dropping below a predetermined threshold value. Again, the invention relies on the very steep transfer function at the output of the differential amplifier before railing occurs, as explained above, and achieves an extended operating range over the conventional approach. In an advantageous embodiment, the voltage detector is formed by an inverter and the predetermined threshold voltage is the gate threshold voltage of the inverter. An inverter is a simple elementary structure that requires little space on the die. The threshold voltage of the inverter does not need to be adjusted very accurately since the transfer function at the output of the differential amplifier is very steep. As an alternative to an inverter, a simple low-accuracy comparator can be used.

BRIEF DESCRIPTION OF THE DRAWINGS

Further advantages and features of the invention will appear from the following description with reference to the appended drawings, wherein.

DETAILED DESCRIPTION OF EMBODIMENTS

Figure 1:
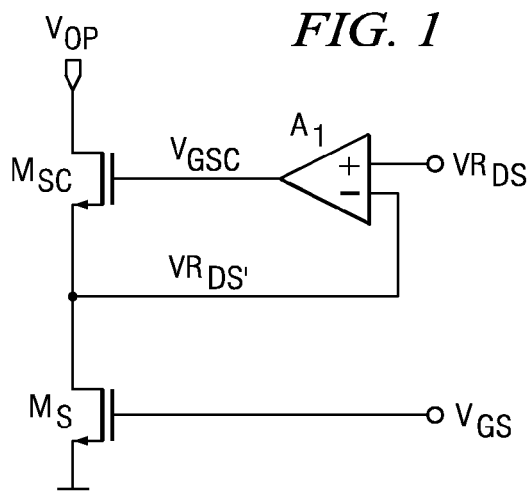
FIG. 1 is a schematic diagram of an impedance enhancement circuit.

The impedance enhancement circuit in FIG. 1 is intended to maintain critical transistors in their optimally biased condition over various operating conditions (temperature, process variation, input and output voltage ranges, current range, etc.) and to improve the output impedance of current mirrors. The CMOS or BiCMOS circuit includes an n-channel control transistor $M_S$ connected in series with an n-channel cascode transistor $M_{SC}$, and a differential amplifier A1. The differential amplifier A1 has an inverting input connected to the node between the control transistor and the cascode transistor, a non-inverting input connected to a reference voltage source $VR_{DS}$ and an output connected to the gate of the cascode transistor $M_{SC}$. A control voltage $V_{GS}$ is applied to the gate of control transistor $M_S$ and the drain of cascode transistor $M_{SC}$ sinks an output current $I_{OUT}$. A similar structure can be built with p-channel transistors, as current source rather than current sink.

The circuit works by the amplifier A1 maintaining a constant operating voltage $VR_{DS}'$ across the transistor $M_S$ despite the various voltage conditions at the node $V_{OP}$ by adjusting the gate drive of the cascading transistor $M_{SC}$. Applications of the method among others include improving the common mode rejection ratio and input range of amplifiers. It can also be used in high voltage output stages.

When the voltage at the node $V_{OP}$ approaches the negative rail, the transistor $M_{SC}$ starts to triode and the amplifier A1 compensates by increasing the gate drive. As a consequence, the voltage across the current source transistor $M_S$ is maintained constant and outside of the trioding range. When this voltage is further decreased, the output of A1 will rail and will no longer be able maintain the constant voltage on $M_S$ and therefore $M_S$ will be trioded. This condition can introduce excess errors in the overall circuit and consequently in many cases needs to be detected and reported.

The conventional method to detect the out-of-useful-range condition is to monitor the voltage at the input/output terminal (for example node $V_{OP}$ on FIG. 1) by a comparator, so that the comparator will flip when the voltage at the node is below the predetermined reference voltage. This invention proposes that monitoring the output of A1 (node $V_{GSC}$) instead provides several advantages.

Figure 2:
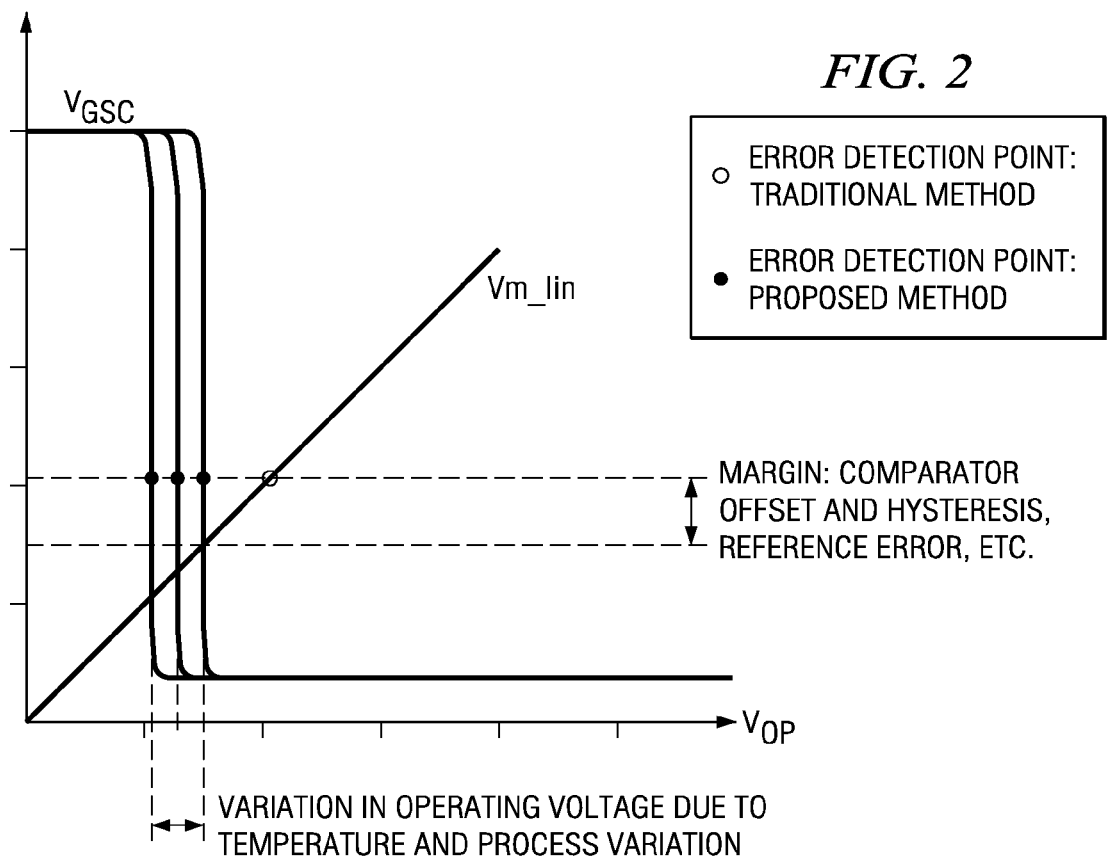
FIG. 2 is a plot of the output voltage at a differential amplifier in FIG. 1 versus the operating voltage.

These advantages can be seen by observing FIG. 2. In FIG. 2, Vm_lin is the voltage at the conventional monitoring point, plotted against the operating voltage (the difference between the input voltage and the negative rail). Since the voltage here is linear, the accuracy of the comparator and of the reference contributes directly to an error in the detection circuitry and therefore an error margin must be built into the system. Additionally, since the input voltage at which $M_S$ stops behaving linearly is temperature and process dependent, the comparator trip-point has to be set away from the actual limit by the margins built in for temperature and process as well. This results in reduced useable range. $V_{GSC}$ in FIG. 2 is the output voltage of the differential amplifier A1. Although the output voltage $V_{GSC}$ does have a temperature and process dependent variation, its behavior is characterized by a very steep transfer function. Due to the very steep transfer function of the output of A1 (node $V_{GSC}$), the trioding of the current source $M_S$ can be detected at this point without the need for accuracy in the detecting circuit. In particular, a simple inverter with its threshold voltage adjusted relatively high is sufficient. No additional margins for process corners or temperature need to be considered. Due to the steep transfer function at the node $V_{GSC}$ the accuracy requirements for the detecting circuitry have been eliminated. This results in significant circuit area and complexity savings in addition to the extended operating range and detection of the actual operation limit. The detection circuit can be a simple inverter with its threshold voltage adjusted by sizing on the die or by level-shifting. Alternatively a simple, small comparator could be used, as its errors do not contribute directly to the detection accuracy.

Figure 3:
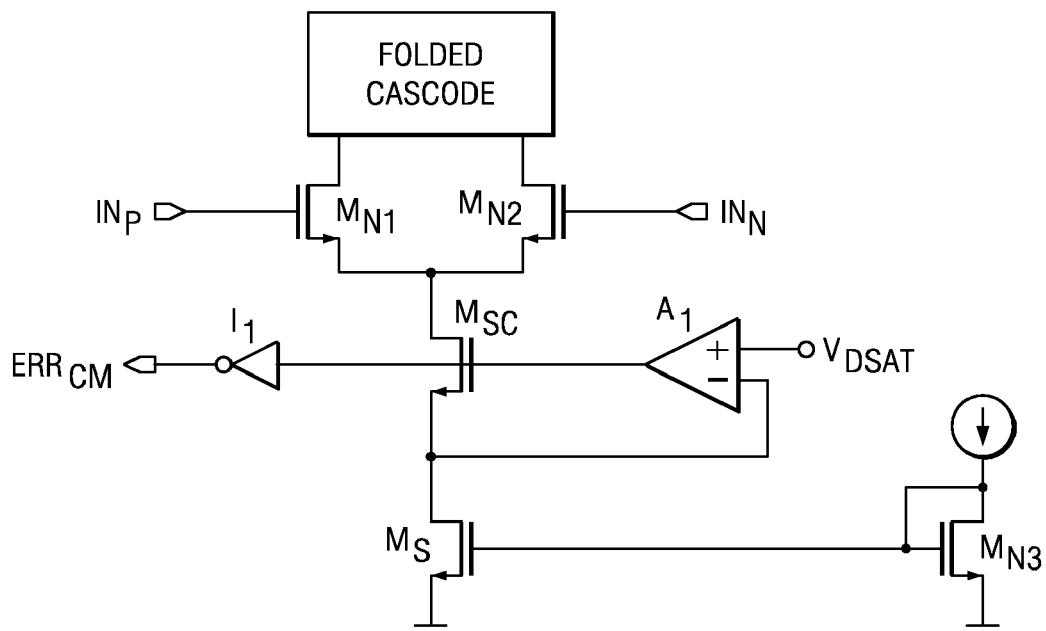
FIG. 3 is a schematic circuit diagram of a first embodiment.

In the embodiment shown in FIG. 3, the condition when the inputs of the amplifiers are outside of the valid common mode input range (CMIR) is detected. FIG. 3 shows a standard amplifier input stage with the addition of the proposed CMIR error detection. The input pair $M_{N1}$, $M_{N2}$ are shown as n-channel MOS transistors but the same would hold for p-channel or bipolar transistors. The input pair is biased by a cascoded tail current source. For most input stages only the detection of one of the CMIR limits is critical (for n-type the negative limit and for p-type the positive limit) because the other limit includes the rail voltage.

As in FIG. 1, an output impedance enhancement method is used to improve the common mode rejection ratio and to extend the CMIR, by driving the gate of the tail current source cascading transistor $M_{SC}$ by a differential amplifier A1. Here, the differential amplifier A1 is referenced to a voltage source $V_{DSAT}$ that estimates the saturation voltage of the tail current source transistor $M_S$ which mirrors the current through a diode-connected NMOS transistor $M_{N3}$.

By the detection of the railing of differential amplifier A1, the departure from the valid common mode input range can be accurately detected with a simple inverter I1 with its threshold voltage adjusted high (or one of the similar methods described above). The main advantage of this method is that it detects the exact limit when the circuit leaves linear operation and therefore requires no additional built-in margin or reference voltages generated, as would be needed when comparators are used to monitor the input voltages at $IN_P$ and $IN_N$. Consequently, with a reliable CMIR error, the useable CMIR detection is extended.

Figure 4:
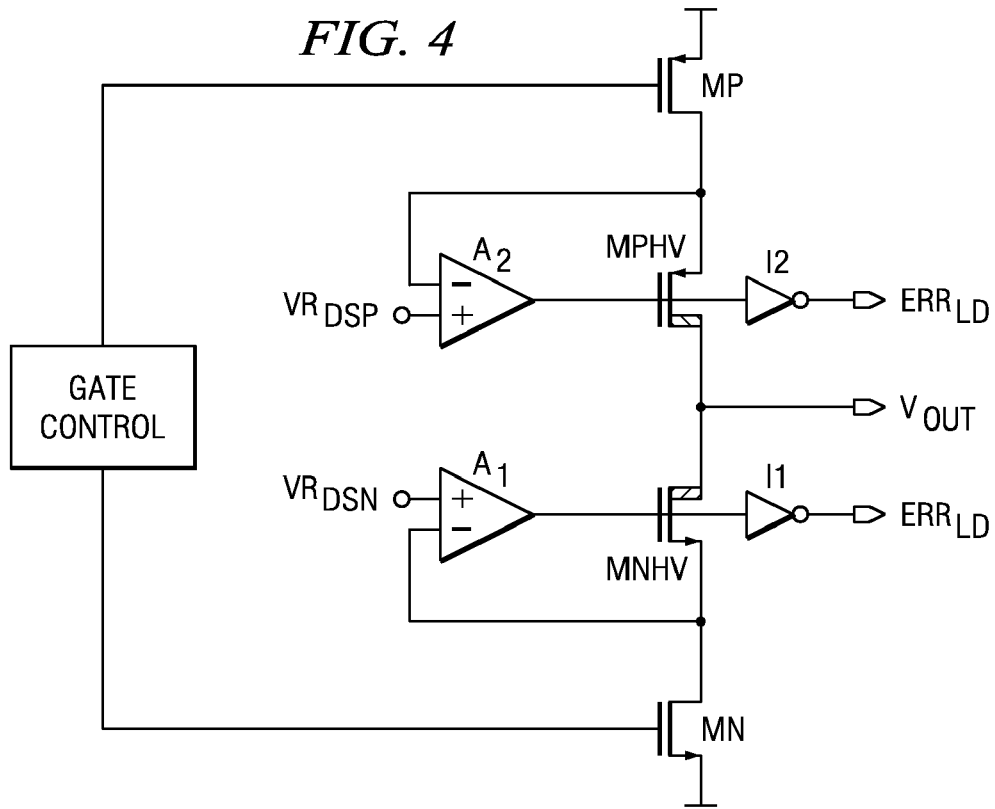
FIG. 4 is a schematic circuit diagram of a second embodiment.

FIG. 4 shows an embodiment to detect when the output of a higher voltage output stage is outside of its valid range. In high voltage output stages, for circuit area, stability and linearity requirements, it is advantageous to use low voltage transistors MN and MP as main output devices and cascode them with cascode transistors MPHV and MNHV, as shown. Transistors MPHV and MNHV may be high voltage transistors for applications that require a high voltage output. By dynamically driving the gates of the high voltage cascading transistors MPHV and MNHV using differential amplifiers A1 and A2, it is possible to maximize the output swing while minimizing circuit area even with a wide output current range.

When the output voltage approaches either rail too closely, the main output transistors MN and MP will triode and the amplifier open loop gain degrades and the amplifier output $V_{OUT}$ can become invalid. Again, this condition can be indicated without the need for additional circuitry by detecting when the differential amplifiers A1 and A2 rail. In the embodiment shown, inverters I1 and I2 provide an error indication when the associated amplifier A1 or A2 rails (i.e., its output voltage approaches the rail voltage). This method detects the exact limit when the circuit leaves linear operation and therefore requires no additional built in margin or reference voltages generated as would be needed when comparators are used to monitor the output voltage $V_{OUT}$. Consequently the useable output range with reliable output overload error detection is extended.

What is claimed is:

1. A method of detecting out-of-range conditions in amplifier CMOS or BiCMOS circuitry that includes a control transistor connected in series with a cascode transistor, and a differential amplifier with a first input connected to a node between the control transistor and the cascode transistor, a second input connected to a reference voltage source and an output connected to a gate of the cascode transistor, comprising the step of monitoring the voltage at the output of the differential amplifier with a voltage detector having an input connected to the output of the differential amplifier and determining an error condition when the voltage exceeds or drops below a predetermined threshold value.

2. An amplifier with CMOS or BiCMOS amplifier circuitry that includes a control transistor connected in series with a cascode transistor and a differential amplifier with a first input connected to a node between the control transistor and the cascode transistor, a second input connected to a reference voltage source and an output connected to a gate of the cascode transistor, the amplifier further comprising a voltage detector with an input connected to the output of the differential amplifier, the voltage detector providing an error output in response to the voltage at the output of the differential amplifier exceeding or dropping below a predetermined threshold value.

3. The amplifier of claim 2, wherein the voltage detector comprises an inverter and the predetermined threshold voltage is the gate threshold voltage of the inverter.

4. The amplifier of claim 3, wherein the threshold of the inverter is adjusted by sizing on the die.

5. The amplifier of claim 3, wherein the threshold of the inverter is adjusted by level shifting.

6. The amplifier of claim 2, wherein the voltage detector is formed by a comparator.

7. The method of claim 1, wherein the voltage is monitored with a voltage detector comprising an inverter, and the predetermined threshold voltage is the gate threshold of the inverter.

8. The method of claim 1, wherein the voltage at the output of the differential amplifier vs. an input operating voltage is characterized by a transfer function with a steep step, and the error condition is determined by detecting the occurrence of the step in the transfer function.

9. The method of claim 8, wherein the voltage detector is an inverter with its threshold voltage determined by sizing on a die or by level-shifting.

10. The method of claim 1, wherein the control transistor is a first n-channel transistor; the cascode transistor is a second n-channel transistor; the first input of the differential amplifier is an inverting input; the node is between a drain of the first transistor and a source of the second transistor; the second input of the differential amplifier is a non-inverting input; a control voltage source is applied to a gate of the first transistor; and a drain of the cascode transistor is connected to sink an output current.

11. The method of claim 10, wherein the circuitry operates to maintain a constant operating voltage across the first n-channel transistor despite changes in voltage at a drain of the second n-channel transistor by adjusting the gate drive of the second n-channel transistor.

12. The method of claim 1, for detecting an out-of-range condition of a common mode voltage of differential inputs of the amplifier circuitry; the circuitry further comprising a differential amplifier input stage including a pair of input transistors biased by a cascaded current source including the control transistor connected in series with the cascode transistor; the reference voltage source providing a voltage that estimates a saturation voltage of the current through the control transistor.

13. The method of claim 12, further comprising a diode-connected transistor connected to provide a mirrored current through the control transistor.

14. The method of claim 13, wherein the voltage detector is an inverter with its threshold voltage adjusted high.

15. The method of claim 1, wherein the control transistor is a first n-channel transistor; the cascode transistor is a second n-channel transistor; the differential amplifier is a first differential amplifier with a first input connected to a node between the first n-channel transistor and the second n-channel transistor, a second input connected to a first reference voltage source, and an output connected to a gate of the second n-channel transistor; the circuitry further comprises a first p-channel transistor connected in series with a second p-channel transistor; a second differential amplifier with a first input connected to a node between the first p-channel transistor and the second p-channel transistor, a second input connected to a second reference voltage source, and an output connected to a gate of the second p-channel transistor; and the method comprises monitoring the voltages at the outputs of the first and second differential amplifiers.

16. The method of claim 15, wherein the voltage detector comprises a first inverter with an input connected to the output of the first differential amplifier, and a second inverter with an input connected to the output of the second differential amplifier.

17. The amplifier of claim 2, wherein the control transistor is a first n-channel transistor; the cascode transistor is a second n-channel transistor; the first input of the differential amplifier is an inverting input; the node is between a drain of the first transistor and a source of the second transistor; and the second input of the differential amplifier is a non-inverting input.

18. The amplifier of claim 2, for detecting an out-of range condition of a common mode voltage of differential inputs of the amplifier circuitry; the circuitry further comprising a differential amplifier input stage including a pair of input transistors connected to be biased by cascaded current source circuitry including the control transistor connected in series with the cascode transistor.

19. The amplifier of claim 18, farther comprising a diode-connected transistor connected to provide a mirrored current through the control transistor.

20. The amplifier of claim 19, wherein the voltage detector comprises an inverter.

21. The amplifier of claim 2, wherein the control transistor is a first n-channel transistor; the cascode transistor is a second n-channel transistor; the differential amplifier is a first differential amplifier with a first input connected to a node between the first n-channel transistor and the second n-channel transistor, a second input connected to a first reference voltage source, and an output connected to a gate of the second n-channel transistor; and wherein the circuitry farther comprises a first p-channel transistor connected in series with a second p-channel transistor; a second differential amplifier with a first input connected to a node between the first p-channel transistor and the second p-channel transistor, a second input connected to a second reference voltage source, and an output connected to a gate of the second p-channel transistor; and the voltage detector is connected for monitoring the voltages at the outputs of the first and second differential amplifiers.

22. The amplifier of claim 21, wherein the voltage detector comprises a first inverter with an input connected to the output of the first differential amplifier, and a second inverter with an input connected to the output of the second differential amplifier.

* * * * *